United States Patent
Gong et al.

(10) Patent No.: US 9,432,007 B1
(45) Date of Patent: Aug. 30, 2016

(54) OUT-OF-BAND (OOB) DETECTION CIRCUIT FOR SERIAL/DESERIALIZER (SERDES)

(71) Applicant: Xilinx, Inc., San Jose, CA (US)

(72) Inventors: Jingfeng Gong, Singapore (SG); Cheng-Hsiang Hsieh, Hsinchu (TW)

(73) Assignee: XILINX, INC., San Jose, CA (US)

( * ) Notice: Subject to any disclaimer, the term of this patent is extended or adjusted under 35 U.S.C. 154(b) by 40 days.

(21) Appl. No.: 14/461,223

(22) Filed: Aug. 15, 2014

(51) Int. Cl.
   H03K 5/22       (2006.01)
   H03K 5/1252    (2006.01)
   H03K 5/24       (2006.01)
   H03K 3/012     (2006.01)

(52) U.S. Cl.
   CPC ............ H03K 5/1252 (2013.01); H03K 3/012 (2013.01); H03K 5/2481 (2013.01)

(58) Field of Classification Search
   CPC .. H03K 5/2481; H03K 5/249; H03K 5/2418; H04L 25/0272; H03F 3/45183
   USPC ......................... 327/63–65, 76, 563; 375/350
   See application file for complete search history.

(56) References Cited

U.S. PATENT DOCUMENTS

| | | | | |
|---|---|---|---|---|
| 6,249,395 | B1 * | 6/2001 | Conway | 360/51 |
| 6,265,858 | B1 * | 7/2001 | Park | 323/313 |
| 6,332,205 | B1 * | 12/2001 | Conway | 714/746 |
| 6,486,710 | B1 * | 11/2002 | Simoni | 327/63 |
| 6,624,699 | B2 * | 9/2003 | Yin et al. | 330/260 |
| 7,944,268 | B2 * | 5/2011 | Okanobu | 327/434 |
| 2002/0158862 | A1 * | 10/2002 | Chen et al. | 345/211 |
| 2006/0033535 | A1 * | 2/2006 | Ishizuka et al. | 327/65 |
| 2006/0132192 | A1 * | 6/2006 | Yu | 327/65 |
| 2009/0027086 | A1 * | 1/2009 | Trifonov | 327/66 |

* cited by examiner

*Primary Examiner* — Quan Tra
(74) *Attorney, Agent, or Firm* — Gerald Chan; Robert M. Brush

(57) ABSTRACT

An out-of-band (OOB) detection circuit includes: a positive input node; a negative input node; a resistive circuit comprising a first resistor coupled between a first supply node and a first node, a variable resistor coupled between the first node and a second node, and a second resistor coupled between the second node and a ground; a first comparator configured to compare a difference between a positive input signal received at the positive input node and a negative input signal received at the negative input node against a positive threshold value, and a second comparator configured to compare the difference between the positive input signal received at the positive input node and the negative input signal received at the negative input node against a negative threshold value.

18 Claims, 7 Drawing Sheets

OUT-OF-BAND (OOB) DETECTION CIRCUIT FOR SERIAL/DESERIALIZER (SERDES)

FIELD

This disclosure relates to a serializer/deserializer (SERDES), and in particular to an out-of-band (OOB) detection circuit for a SERDES.

BACKGROUND

A serializer/deserializer (SERDES) is a transceiver which functions as a critical block component of field programmable gate array (FPGA) products. The SERDES has various operating modes including a normal operating mode and a low power mode. The SERDES toggles between these operating modes in response to signals being received at the receiving end of the SERDES. An out-of-band (OOB) detection circuit is typically implemented within the SERDES for analyzing those received signals for determining which mode of operation should be established for the SERDES.

When the OOB detection circuit fails to detect a "present" signal within a threshold period of time, the OOB detection circuit determines that the SERDES should operate in a low power mode. When the OOB detection circuit does detect a "present" signal within a threshold period of time, the OOB detection circuit determines that the SERDES should operating in a normal operating mode. The signals received by the OOB detection circuit are received as input differential pairs (e.g, a positive signal and a complementary negative signal). The OOB detection circuit then compares the difference in magnitude between the input differential pairs against a threshold value to determine whether an "absent" signal or a "present" signal is detected.

Conventional OOB detection circuits suffer from several disadvantages. The main disadvantage of conventional OOB detection circuits is their inability to detect a "present signal" for both positive and negative polarities. When an input differential pair includes a positive input signal ($In_p$) and a negative input signal ($In_n$), the conventional OOB detection circuit is only able to detect a "present" signal where the $In_p-In_n$ is greater than the threshold value. Where the absolute value of $In_n-In_p$ is greater than the threshold value, the conventional OOB detection circuit will detect a false "absent" signal, thereby potentially placing the SERDES in a low-power mode where it should be operating in a normal operating mode.

Additionally, conventional OOB detection circuits suffer from significant power consumption and typically occupy large areas, both of which are undesirable characteristics for a SERDES.

SUMMARY

An out-of-band (OOB) detection circuit includes: a positive input node; a negative input node; a resistive circuit comprising a first resistor coupled between a first supply node and a first node, a variable resistor coupled between the first node and a second node, and a second resistor coupled between the second node and a ground; a first comparator configured to compare a difference between a positive input signal received at the positive input node and a negative input signal received at the negative input node against a positive threshold value, and a second comparator configured to compare the difference between the positive input signal received at the positive input node and the negative input signal received at the negative input node against a negative threshold value. The first comparator includes: a first transistor having a gate coupled to the positive input node; a second transistor having a gate coupled to the negative input node; a third transistor having a gate coupled to the second node; and a fourth transistor having a gate coupled to the first node. The second comparator includes: a fifth transistor having a gate coupled to the negative input node; a sixth transistor having a gate coupled to the positive input node; a seventh transistor having a gate coupled to the second node; and an eighth transistor having a gate coupled to the first node.

An out-of-band (OOB) detection circuit includes: a positive input node; a negative input node; a resistive circuit comprising a first resistor coupled between a first supply node and a first node, a variable resistor coupled between the first node and a second node, and a second resistor coupled between the second node and a ground; an initial gain stage comprising a first gain transistor having a gate coupled to the positive input node, and a second gain transistor having a gate coupled to the negative input node; a first comparator; and a second comparator. The first comparator includes: a first transistor having a gate coupled to a drain of the second gain transistor; a second transistor having a gate coupled to a drain of the first gain transistor; a third transistor having a gate coupled to the second node; and a fourth transistor having a gate coupled to the first node. The second comparator includes: a fifth transistor having a gate coupled to the drain of the second gain transistor; a sixth transistor having a gate coupled to the drain of the first gain transistor; a seventh transistor having a gate coupled to the second node; and an eighth transistor having a gate coupled to the first node.

Other and further aspects and features will be evident from reading the following detailed description.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered which are illustrated in the accompanying drawings. These drawings depict only typical embodiments and are not therefore to be considered limiting of the scope of the claims.

DETAILED DESCRIPTION

Figure 1:
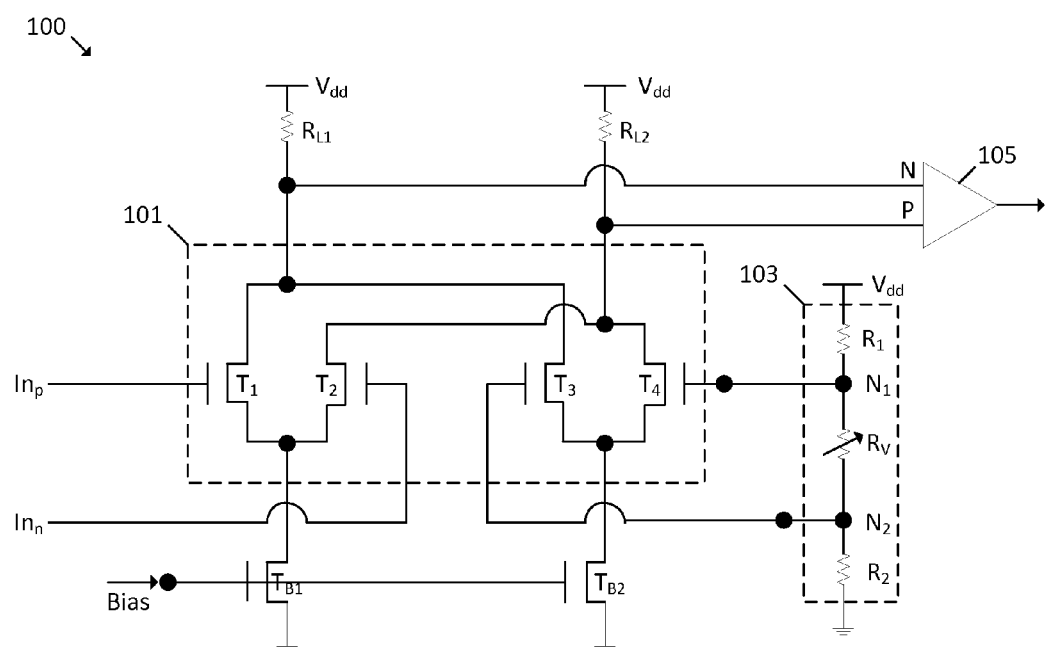
FIG. 1 is a schematic diagram illustrating an out-of-band (OOB) detection circuit for a SERDES.

Various embodiments are described hereinafter with reference to the figures. It should be noted that the figures are not drawn to scale and that the elements of similar structures or functions are represented by like reference numerals throughout the figures. It should be noted that the figures are only intended to facilitate the description of the embodiments. They are not intended as an exhaustive description of the invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

A serializer/deserializer (SERDES) is a transceiver which functions as a critical block component of field programmable gate array (FPGA) products. The SERDES has various operating modes including a normal operating mode and a low power mode. The SERDES toggles between these operating modes in response to signals being received at the receiving end of the SERDES. An out-of-band (OOB) detection circuit is typically implemented within the SERDES for analyzing those received signals for determining which mode of operation should be established for the SERDES.

When the OOB detection circuit fails to detect a "present" signal within a threshold period of time, the OOB detection circuit determines that the SERDES should operate in a low power mode. When the OOB detection circuit does detect a "present" signal within a threshold period of time, the OOB detection circuit determines that the SERDES should operating in a normal operating mode. The signals received by the OOB detection circuit are received as input differential pairs (e.g, a positive signal and a complementary negative signal). The OOB detection circuit then compares the difference in magnitude between the input differential pairs against a threshold value to determine whether an "absent" signal or a "present" signal is detected.

In accordance with some embodiments, an OOB detection circuit includes: a positive input node; a negative input node; a resistive circuit comprising a first resistor coupled between a first supply node and a first node, a variable resistor coupled between the first node and a second node, and a second resistor coupled between the second node and a ground; a first comparator configured to compare a difference between a positive input signal received at the positive input node and a negative input signal received at the negative input node against a positive threshold value, and a second comparator configured to compare the difference between the positive input signal received at the positive input node and the negative input signal received at the negative input node against a negative threshold value. The first comparator is coupled to a first gain stage, and the second comparator is coupled to a second gain stage. An OR gate is coupled to the output of the first gain stage and the output of the second gain stage. Whenever the OR gate receives a "present" signal from the first gain stage or the second gain stage, the OR gate will output a "present signal". Whenever the OR gate receives an "absent" signal from the first gain stage and the second gain stage, the OR gate will output an "absent" signal. Thus, by adding a second comparator, the OOB detection circuit is able to detect a "present" signal for both positive and negative polarities.

FIG. 1 illustrates an OOB detection circuit. The OOB detection circuit 100 includes a pair of input nodes $In_p$ (positive input node) and $In_n$ (negative input node), a comparator 101, loading resistors $R_{L1}$ and $R_{L2}$, biasing transistors $T_{B1}$ and $T_{B2}$, a resistive circuit 103, and a gain stage 105.

The resistive circuit 103 includes a first resistor $R_1$ coupled between a supply node $V_{dd}$ and a first node $N_1$, a variable resistor $R_V$ coupled between the first node $N_1$ and a second node $N_2$, and a second resistor $R_2$ coupled between the second node $N_2$ and the ground.

The comparator 101 includes a first transistor $T_1$, a second transistor $T_2$, a third transistor $T_3$ and a fourth transistor $T_4$. The first transistor $T_1$, second transistor $T_2$, third transistor $T_3$ and fourth transistor $T_4$ each include a gate, a source, and a drain.

The gate of the first transistor $T_1$ is coupled to the positive input node $In_p$, the drain of the first transistor $T_1$ is coupled to the drain of the third transistor $T_3$, and the source of the first transistor $T_1$ is coupled to the source of the second transistor $T_2$.

The gate of the second transistor $T_2$ is coupled to the negative input node $In_n$, the drain of the second transistor $T_2$ is coupled to the drain of the fourth transistor $T_4$, and the source of the second transistor $T_2$ is coupled to the source of the first transistor $T_1$.

The gate of the third transistor $T_3$ is coupled to the second node $N_2$, the drain of the third transistor $T_3$ is coupled to the drain of the first transistor $T_1$, and the source of the third transistor $T_3$ is coupled to the source of the fourth transistor $T_4$.

The gate of the fourth transistor $T_4$ is coupled to the first node $N_2$, the drain of the fourth transistor $T_4$ is coupled to the drain of the second transistor $T_2$, and the source of the fourth transistor $T_4$ is coupled to the source of the third transistor $T_3$.

A positive input P of gain stage 105 is coupled to the drain of the second transistor $T_2$ and the drain of the fourth transistor $T_4$ and a negative input N of gain stage 105 is coupled to the drain of the first transistor $T_1$ and the drain of the third transistor $T_3$.

A first loading resistor $R_{L1}$ is coupled between the supply node $V_{dd}$ and the negative input N of the gain stage 105 and a second loading resistor $R_{L2}$ is coupled between the supply node $V_{dd}$ and the positive input P of the gain stage 105.

A first biasing transistor $T_{B1}$ is coupled between the source of the first transistor $T_1$ and the ground. A second biasing transistor $T_{B2}$ is coupled between the source of the third transistor $T_3$ and the ground. The gate of the first biasing transistor $T_{B1}$ and the gate of the second biasing transistor $T_{B2}$ are coupled to a bias voltage.

In operation, differential signal pairs are received at the positive input node $In_p$ and the negative input node $In_n$ of the OOB detection circuit 100. The difference in magnitude between the signals at the positive input node $In_p$ and the negative input node $In_n$ are compared against a threshold value, which is set by adjusting the resistance of the variable resistor $R_V$ of the resistive circuit 103. When the difference in magnitude between the signals at the positive input node $In_p$ and the negative input node $In_n$ exceed the threshold value set by the variable resistor $R_V$, the gain stage 105 outputs a "present" signal. When the difference in magnitude between the signals at the positive input node $In_p$ and the negative input node $In_n$ instead fall below the threshold value set by the variable resistor $R_V$, the gain stage outputs an "absent" signal.

The OOB detection circuit 100 illustrated in FIG. 1 suffers from several disadvantages. The main disadvantage of conventional OOB detection circuit 100 illustrated in FIG. 1 is its inability to detect a "present" signal for both positive and negative polarities. When an input differential pair includes a positive input signal ($In_p$) and a negative input signal ($In_n$), the OOB detection circuit 100 is only able to detect a "present" signal where the magnitude of $In_p$–$In_n$ is greater than the threshold value. Where the absolute value of $In_n$–$In_p$ is greater than the threshold value, the conventional OOB detection circuit will detect a false "absent" signal, thereby potentially placing the SERDES in a low-power mode where it should be operating in a normal operating mode.

Figure 2:
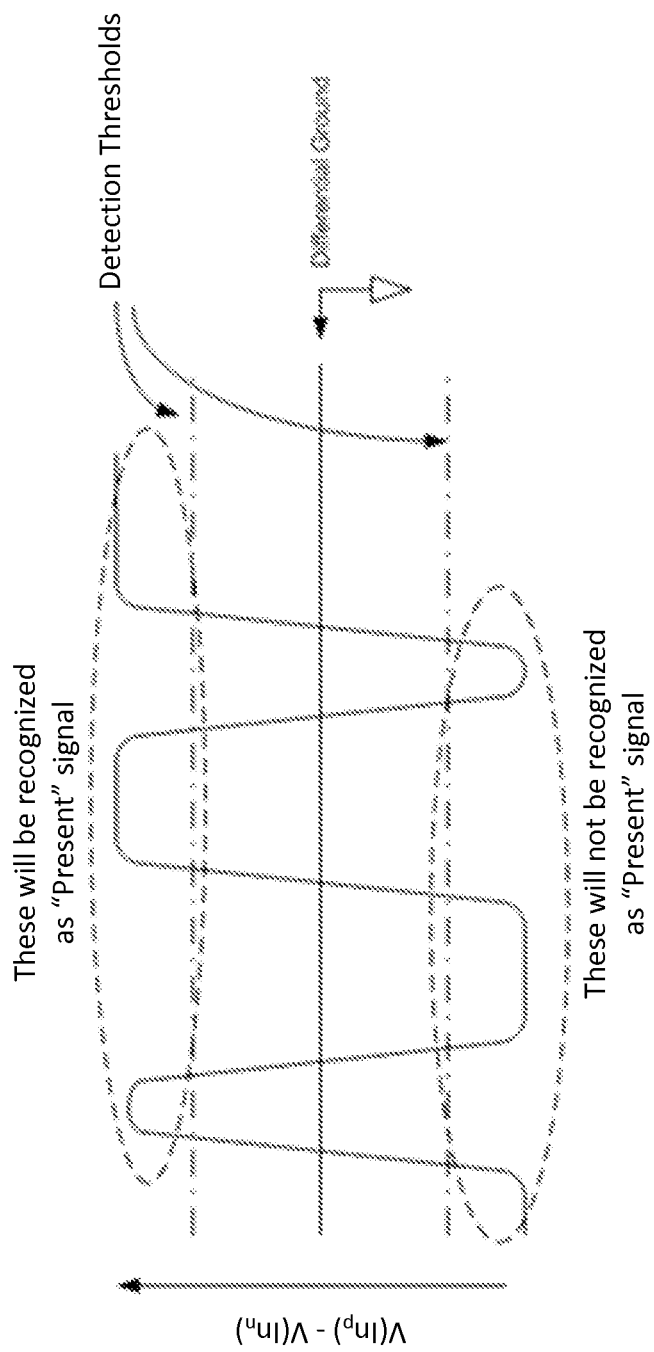
FIG. 2 illustrates an OOB detection circuit's inability to detect a "present" signal for both positive and negative polarities.

FIG. 2 illustrates this problem. In FIG. 2, the solid line illustrates the difference in magnitude between the positive input signal and the negative input signal and the dotted line illustrates the threshold value (both positive and negative). The OOB detection circuit 100 of FIG. 1 is able to detect a "present" signal where the difference in magnitude between positive input signal and the negative input signal is positive and exceeds the positive threshold value. However, the OOB detection circuit 100 of FIG. 1 is unable to detect a "present" signal where the difference in magnitude between the positive input signal and the negative input signal is negative and falls below the negative threshold value. Instead, a false "absent" signal is detected under such circumstances. A false "absent" signal will potentially place the SERDES into a low-power mode where it should be operating in a normal power mode, thus causing unwanted behavior.

In order to implement an OOB detection circuit that is able to detect a "present" signal for both positive and negative polarities, an additional comparator may be introduced for detecting a "present" signal where the difference in magnitude between the positive input signal and the negative input signal is negative and falls below the negative threshold value.

Figure 3:
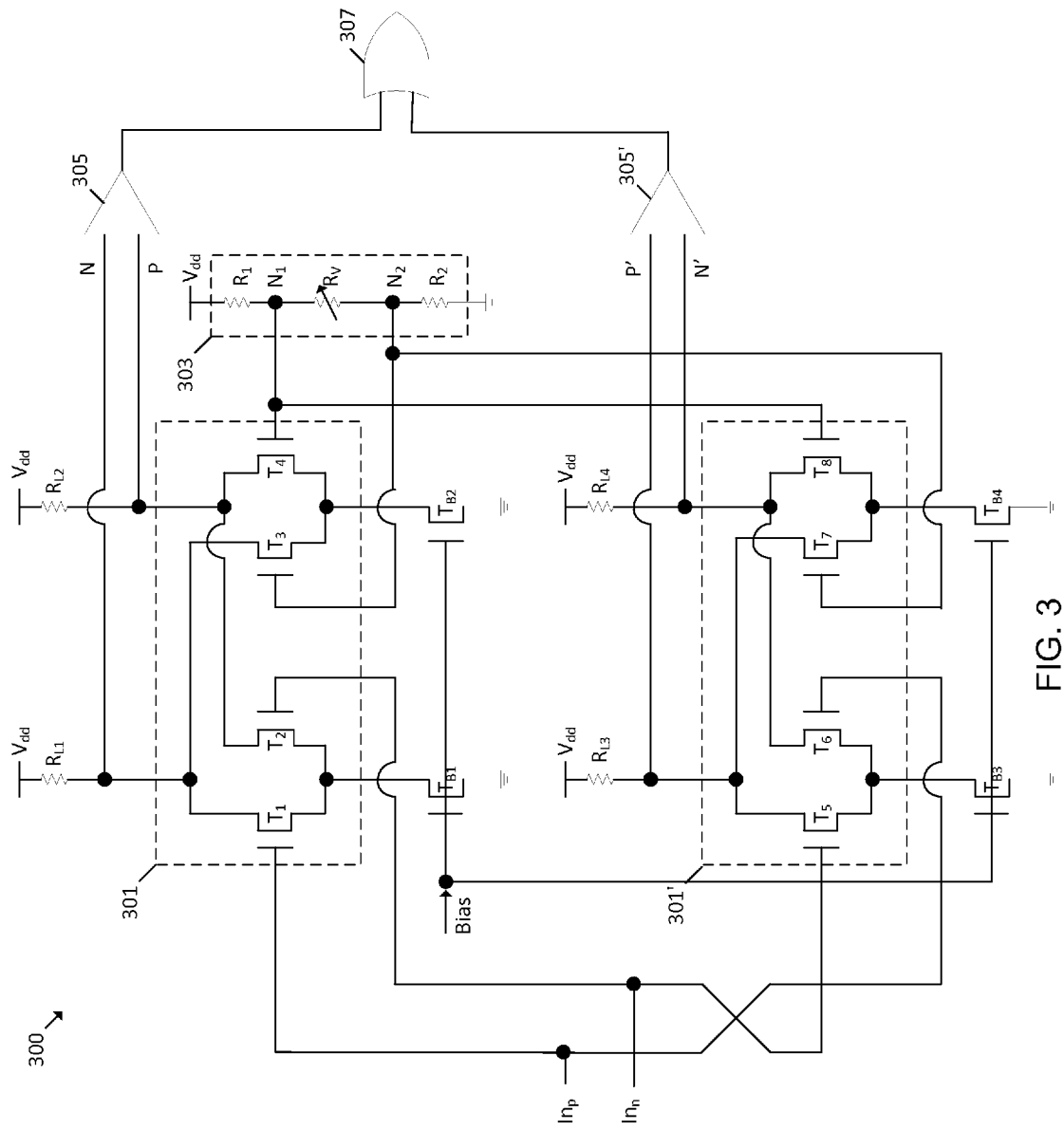
FIG. 3 is a schematic diagram illustrating another OOB detection circuit for a SERDES.

FIG. 3 illustrates an OOB detection circuit 300 according to some embodiments. The OOB detection circuit 300 includes a pair of input nodes $In_p$ (positive input node) and $In_n$ (negative input node), a first comparator 301, a second comparator 301', loading resistors $R_{L1}$, $R_{L2}$, $R_{L3}$ and $R_{L4}$, biasing transistors $T_{B1}$, $T_{B2}$, $T_{B3}$ and $T_{B4}$, a resistive circuit 303, a first gain stage 305, a second gain stage 305', and an OR gate 307.

The resistive circuit 303 includes a first resistor $R_1$ coupled between a supply node $V_{dd}$ and a first node $N_1$, a variable resistor $R_V$ coupled between the first node $N_1$ and a second node $N_2$, and a second resistor $R_2$ coupled between the second node $N_2$ and the ground.

The first comparator 301 includes a first transistor $T_1$, a second transistor $T_2$, a third transistor $T_3$ and a fourth transistor $T_4$. The first transistor $T_1$, second transistor $T_2$, third transistor $T_3$ and fourth transistor $T_4$ each include a gate, a source, and a drain.

The gate of the first transistor $T_1$ is coupled to the positive input node $In_p$, the drain of the first transistor $T_1$ is coupled to the drain of the third transistor $T_3$, and the source of the first transistor $T_1$ is coupled to the source of the second transistor $T_2$.

The gate of the second transistor $T_2$ is coupled to the negative input node $In_n$, the drain of the second transistor $T_2$ is coupled to the drain of the fourth transistor $T_4$, and the source of the second transistor $T_2$ is coupled to the source of the first transistor $T_1$.

The gate of the third transistor $T_3$ is coupled to the second node $N_2$, the drain of the third transistor $T_3$ is coupled to the drain of the first transistor $T_1$, and the source of the third transistor $T_3$ is coupled to the source of the fourth transistor $T_4$.

The gate of the fourth transistor $T_4$ is coupled to the first node $N_2$, the drain of the fourth transistor $T_4$ is coupled to the drain of the second transistor $T_2$, and the source of the fourth transistor $T_4$ is coupled to the source of the third transistor $T_3$.

A positive input P of the first gain stage 305 is coupled to the drain of the second transistor $T_2$ and the drain of the fourth transistor $T_4$ and a negative input N of the first gain stage 305 is coupled to the drain of the first transistor $T_1$ and the drain of the third transistor $T_3$.

A first loading resistor $R_{L1}$ is coupled between the supply node $V_{dd}$ and the negative input N of the first gain stage 105 and a second loading resistor $R_{L2}$ is coupled between the supply node $V_{dd}$ and the positive input P of the first gain stage 105.

A first biasing transistor $T_{B1}$ is coupled between the source of the first transistor $T_1$ and the ground. A second biasing transistor $T_{B2}$ is coupled between the source of the third transistor $T_3$ and the ground. The gate of the first biasing transistor $T_{B1}$ and the gate of the second biasing transistor $T_{B2}$ are coupled to a bias voltage.

The second comparator 301' includes a fifth transistor $T_5$, a sixth transistor $T_6$, a seventh transistor $T_7$ and an eighth transistor $T_8$. The fifth transistor $T_5$, sixth transistor $T_6$, seventh transistor $T_7$ and eighth transistor $T_8$ each include a gate, a source, and a drain.

The gate of the fifth transistor $T_5$ is coupled to the negative input node $In_n$, the drain of the fifth transistor $T_5$ is coupled to the drain of the seventh transistor $T_7$, and the source of the fifth transistor $T_5$ is coupled to the source of the sixth transistor $T_6$.

The gate of the sixth transistor $T_6$ is coupled to the positive input node $In_p$, the drain of the sixth transistor $T_6$ is coupled to the drain of the eighth transistor $T_8$, and the source of the sixth transistor $T_6$ is coupled to the source of the fifth transistor $T_5$.

The gate of the seventh transistor $T_7$ is coupled to the second node $N_2$, the drain of the seventh transistor $T_7$ is coupled to the drain of the fifth transistor $T_5$, and the source of the seventh transistor $T_7$ is coupled to the source of the eighth transistor $T_8$.

The gate of the eighth transistor $T_8$ is coupled to the first node $N_1$, the drain of the eighth transistor $T_8$ is coupled to the drain of the sixth transistor $T_6$, and the source of the eighth transistor $T_8$ is coupled to the source of the seventh transistor $T_7$.

A positive input P' of the second gain stage 305' is coupled to the drain of the fifth transistor $T_5$ and the drain of the seventh transistor $T_7$ and a negative input N' of the second gain stage 305' is coupled to the drain of the sixth transistor $T_6$ and the drain of the eighth transistor $T_8$.

A third loading resistor $R_{L3}$ is coupled between the supply node $V_{dd}$ and the positive input P' of the second gain stage 305' and a fourth loading resistor $R_{L4}$ is coupled between the supply node $V_{dd}$ and the negative input N' of the second gain stage 305'.

A third biasing transistor $T_{B3}$ is coupled between the source of the fifth transistor $T_5$ and the ground. A fourth biasing transistor $T_{B4}$ is coupled between the source of the seventh transistor $T_7$ and the ground. The gate of the third biasing transistor $T_{B3}$ and the gate of the fourth biasing transistor $T_{B4}$ are also coupled to the bias voltage.

In operation, differential signal pairs are received at the positive input node $In_p$ and the negative input node $In_n$ of the OOB detection circuit 300. The difference in magnitude between the signals at the positive input node $In_p$ and the negative input node $In_n$ are compared against a threshold value, which is set by adjusting the resistance of the variable resistor $R_V$ of the resistive circuit 303.

The first comparator 301 is configured to compare the difference between the positive input signal received at the positive input node $In_p$ and the negative input signal received at the negative input node $In_n$ against a positive threshold value. When the difference between the positive input signal and the negative input signal exceed the positive threshold value, the first gain stage 305 will output a "present" signal. When the difference between the positive input signal and the negative input signal fall below the positive threshold value, the first gain stage 305 will output an "absent" signal.

The second comparator 301' is configured to compare the difference between the positive input signal received at the positive input node $In_p$ and the negative input signal received at the negative input node $In_n$ against a negative threshold value. When the difference in magnitude between the positive input signal and the negative input signal fall below the negative threshold value, the second gain stage 305' will output a "present" signal. When the difference in magnitude between the positive input signal and the negative input signal exceed the negative threshold value, the second gain stage 305' will output an "absent" signal.

An OR gate 307 is coupled to the output of the first gain stage 305 and the output of the second gain stage 305'. Whenever the OR gate 307 receives a "present" signal from the first gain stage 305 or the second gain stage 305', the OR gate 307 will output a "present signal". Whenever the OR gate 307 receives an "absent" signal from the first gain stage 305 and the second gain stage 305', the OR gate 307 will output an "absent" signal.

Thus, by adding a second comparator, the OOB detection circuit 300 is able to detect a "present" signal for both positive and negative polarities.

Rather than having the positive input node $In_p$ and the negative input node $In_n$ connect directly to the first comparator 301 and second comparator 301', the positive input node $In_p$ and the negative input node $In_n$ may first pass through an initial gain stage in order to reduce capacitive loading.

Figure 4:
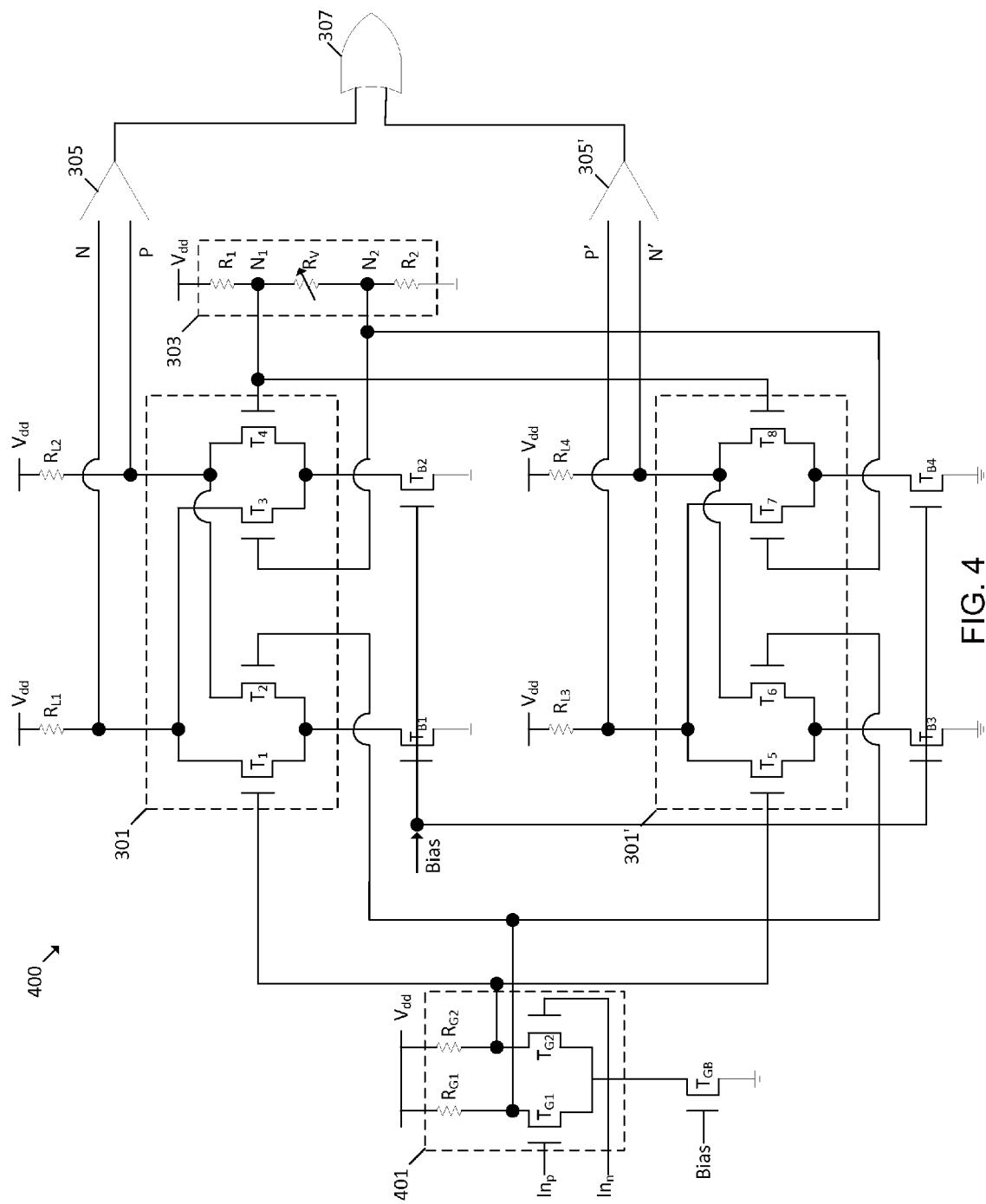
FIG. 4 is a schematic diagram illustrating another OOB detection circuit for a SERDES.

FIG. 4 illustrates an OOB detection circuit 400 having an initial gain stage according to some embodiments. The first comparator 301, second comparator 303 loading resistors $R_{L1}$, $R_{L2}$, $R_{L3}$ and $R_{L4}$, biasing transistors $T_{B1}$, $T_{B2}$, $T_{B3}$ and $T_{B4}$, resistive circuit 303, first gain stage 305, second gain stage 305', and an OR gate 307 are substantially similar to those described in FIG. 3 and as such will not be described again in detail.

The OOB detection circuit 400 of FIG. 4 includes an additional initial gain stage 401 having a first transistor $T_{G1}$, a second transistor $T_{G2}$, a first gain resistor $R_{G1}$, a second gain transistor $R_{G2}$, and a biasing transistor $T_{GB}$. The first transistor $T_{G1}$, second transistor $T_{G2}$ and biasing transistor $T_{GB}$ each have a gate, source and drain.

The first resistor $R_{G1}$ is coupled between the supply node $V_{dd}$ and the drain of the first transistor $T_{G1}$. The second resistor $R_{G2}$ is coupled between the supply node $V_{dd}$ and the drain of the second transistor $T_{G1}$. The gate of the first transistor $T_{G1}$ is coupled to the positive input node $In_p$ and the gate of the second transistor $T_{G2}$ is coupled to the negative input node $In_n$. The source of the first transistor $T_{G1}$ is coupled to the source of the second transistor $T_{G2}$. The biasing transistor $T_{GB}$ is coupled between the source of the first transistor $T_{G1}$ and the ground.

The drain of the first transistor $T_{G1}$ is coupled to the gate of the second transistor $T_2$ of the first comparator 301 and also coupled to the gate of the sixth transistor $T_6$ of the second comparator 301'. The drain of the second transistor $T_{G2}$ is coupled to the gate of the first transistor $T_1$ of the first comparator 301 and also coupled to the gate of the fifth transistor $T_5$ of the second comparator 301'.

As mentioned above, by connecting the positive input node $In_p$ and the negative input node $In_n$ to the initial gain stage 401 rather than directly to the first comparator 301 and second comparator 301', capacitive loading associated with the OOB detection circuit 400 may be reduced.

The OOB detection circuit 300 described in FIG. 3 and OOB detection circuit 400 described in FIG. 4 may be further improved by reducing its overall effect on the power consumption of the SERDES. Power consumption of the SERDES may be reduced by introducing cross-coupled capacitors to the OOB detection circuit 300, 400, or alternatively by introducing loading transistors to the OOB detection circuit 300, 400.

Figure 5A:
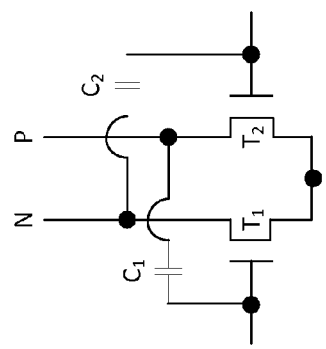
FIG. 5A is a schematic diagram illustrating an alternative comparator for the OOB detection circuit.
Figure 5A:
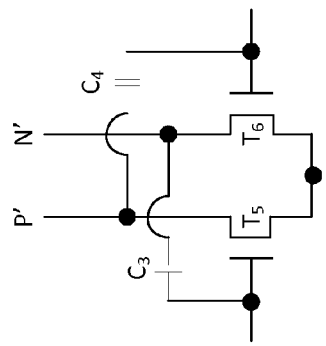
Figure 5B:
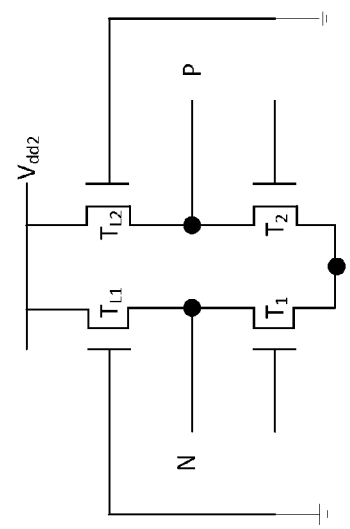
FIG. 5B is a schematic diagram illustrating another alternative comparator for the OOB detection circuit.
Figure 5B:
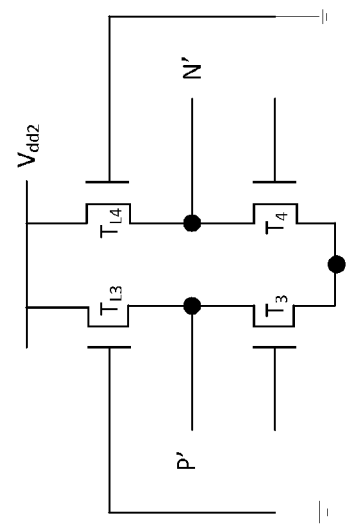

FIGS. 5A and 5B will be used to illustrate modifications that can may made to the OOB detection circuit 300 of FIG. 3 or to the OOB detection circuit 400 of FIG. 4 to reduce power consumption.

FIG. 5A illustrates the introduction of cross-coupled capacitors to the OOB detection circuit 300/400. For purposes of simplicity, only the relevant portions of the OOB detection circuit 300, 400 of FIGS. 3 and 4 will be illustrated. The left-hand side of FIG. 5A illustrates the introduction of cross-coupled capacitors to the first comparator 301 of the OOB detection circuit 300/400 of FIG. 3/4 and the right-hand side of FIG. 5A illustrates the introduction of cross-coupled capacitors to the second comparator 301' of the OOB detection circuit 300/400 of FIG. 3/4.

A first capacitor $C_1$ may be coupled between the gate of the first transistor $T_1$ of the first comparator 301 and the drain second transistor $T_2$ of the first comparator 301. A second capacitor $C_2$ may be coupled between the gate of the second transistor $T_2$ of the first comparator 301 and the drain of the first transistor $T_1$ of the first comparator 301.

A third capacitor $C_3$ may be coupled between the gate of the fifth transistor $T_5$ of the second comparator 301' and the drain sixth transistor $T_6$ of the second comparator 301'. A fourth capacitor $C_4$ may be coupled between the gate of the sixth transistor $T_6$ of the second comparator 301' and the drain of the fifth transistor $T_5$ of the second comparator 301'.

By utilizing cross-coupling in this manner, the gate capacitance of the next stage may be neutralized, thereby reducing overall power consumption of the SERDES.

FIG. 5B illustrates the introduction of loading transistors to the OOB detection circuit 300/400. For purposes of simplicity, only the relevant portions of the OOB detection circuit 300, 400 of FIGS. 3 and 4 will be illustrated. The left-hand side of FIG. 5B illustrates the introduction of loading transistors to the first comparator 301 of the OOB detection circuit 300/400 of FIG. 3/4 and the right-hand side of FIG. 5B illustrates the introduction of loading transistors to the second comparator 301' of the OOB detection circuit 300/400 of FIG. 3/4.

A first loading transistor $T_{L1}$ may be coupled between the negative input N of the first gain stage 305 and a second supply node $V_{dd2}$. The first loading transistor $T_{L1}$ is also coupled between the drain of the first transistor $T_1$ of the first comparator 301 and the second supply node $V_{dd2}$.

A second loading transistor $T_{L2}$ may be coupled between the positive input P of the first gain stage 305 and the second supply node $V_{dd2}$. The second loading transistor $T_{L2}$ is also coupled between the drain of the second transistor $T_2$ of the first comparator 301 and the second supply node $V_{dd2}$.

A third loading transistor $T_{L3}$ may be coupled between the positive input P' of the second gain stage 305' and the second supply node $V_{dd2}$. The third loading transistor $T_{L3}$ is also coupled between the drain of the fifth transistor $T_5$ of the second comparator 301' and the second supply node $V_{dd2}$.

A fourth loading transistor $T_{L4}$ may be coupled between the negative input N' of the second gain stage 305' and the second supply node $V_{dd2}$. The fourth loading transistor $T_{L4}$ is also coupled between the drain of the sixth transistor $T_6$ of the second comparator 301' and the second supply node $V_{dd2}$.

By utilizing loading transistors in this manner, the overall power consumption of the SERDES may be reduced and the area footprint of the OOB detection circuit may also be reduced.

During a given detection period, the OOB detection circuit receives a stream of differential signals. If any pair of differential signals within that stream is determined to be a "present" signal, then a "present" signal should be provided downstream to the other components of the SERDES. Even if only a single "present" signal is identified during the detection period, and several "absent" signals are also identified during the detection period, a "present" signal should be provided downstream.

Because the OOB detection circuit described in FIGS. 3, 4, 5A and 5B continuously outputs "present" or "absent" signals in response to received differential pairs, a detection filter is needed to capture whether a "present" signal or an "absent" signal should be recognized during the detection period and be provided downstream.

The detection filter acts as a memory during the detection period, such that if a single "present" signal is received from the OOB circuit during the detection period, the "present" signal will be memorized and provided downstream at the end of the detection period. If no "present" signal is received from the OOB circuit during the detection period, an "absent" signal will be recognized and provided downstream at the end of the detection period.

Figure 6:
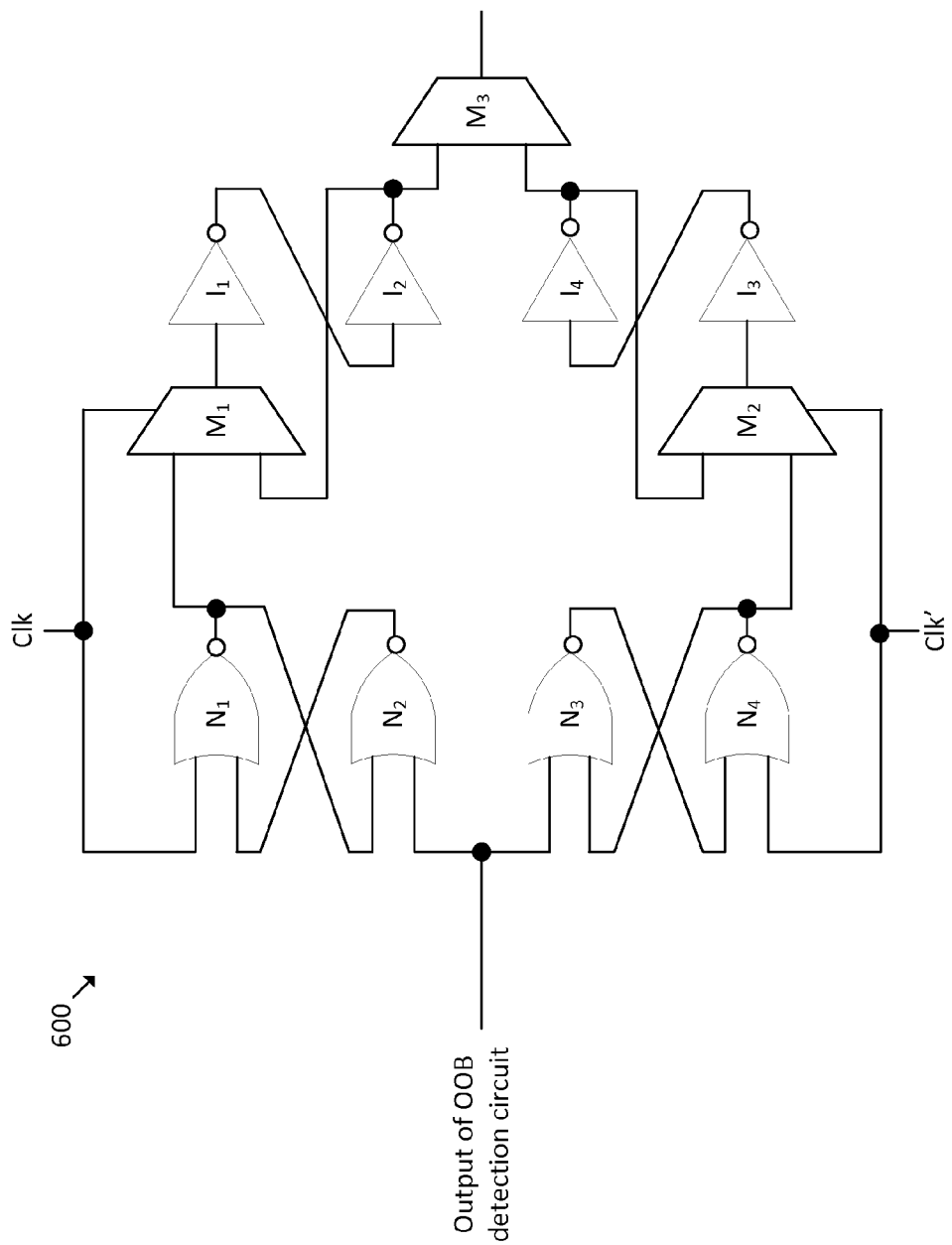
FIG. 6 is a schematic diagram illustrating a detection filter for an OOB detection circuit.

FIG. 6 is a schematic diagram illustrating a detection filter in accordance with some embodiments. The detection filter 600 is coupled to the output of the OR gate 307 of the OOB detection circuit 300, 400 in FIGS. 3 and 4.

The detection filter 600 includes NOR gates $N_1$, $N_2$, $N_3$ and $N_4$, multiplexers $M_1$, $M_2$ and $M_3$, and inverters $I_1$, $I_2$, $I_3$ and $I_4$.

NOR gates $N_2$ and $N_3$ each have an input coupled to the output of the OR gate. NOR gate $N_1$ has an input coupled to a clock signal Clk and NOR gate $N_2$ has an input coupled to the inverse clock signal Clk'.

Additionally, an output of NOR gate $N_1$ is coupled to another input of NOR gate $N_2$, an output of NOR gate $N_2$ is coupled to another input of NOR gate $N_1$, an output of NOR gate $N_3$ is coupled to another input of NOR gate $N_4$, and an output of NOR gate $N_4$ is coupled to another input of NOR gate $N_3$.

Multiplexer $M_1$ has an input coupled to an output of NOR gate $N_1$ and is driven by the clock signal Clk. Multiplexer $M_2$ has an input coupled to an output of NOR gate $N_4$ and is driven by the inverse of the clock signal Clk'.

Inverter $I_1$ has an input coupled to the output of multiplexer $M_1$. Inverter $I_2$ has an input coupled to the output of inverter $I_1$ and an output coupled to another input of multiplexer $M_1$. Inverter $I_3$ has an input coupled to an output of multiplexer $M_2$. Inverter $I_4$ has an input coupled to an output of inverter $I_3$ and an output coupled to another input of multiplexer $M_2$.

Multiplexer $M_3$ has a first input coupled to the output of inverter $I_2$ and a second input coupled to the output of inverter $I_4$.

In operation, the detection filter 600 has two modes of operation, namely a non-detection mode (e.g., latch mode) and a detection mode.

When the clock signal is high, NOR gates $N_1$ and $N_2$, multiplexer $M_1$ and inverters $I_1$ and $I_2$ are in non-detection mode (e.g., latch mode) and will output a signal that was recognized during a previous detection period. Where the previous detection period recognized a "present" signal, the output of inverter $I_2$ will continue to output a "present" signal while in non-detection mode. Where the previous detection period recognized an "absent" signal, the output of inverter $I_2$ filter will continue to output a "present" signal while in non-detection mode.

Conversely, when the clock signal is high, NOR gates $N_3$ and $N_4$, multiplexer $M_2$ and inverters $I_3$ and $I_4$ are in detection mode, acting as a latch during the detection period, such that when a "present" signal is received from the OR gate of the OOB detection circuit, it memorizes the "present" signal for the remainder of the detection period. When a "present" signal is received from the OR gate of the OOB detection circuit, it memorizes the "present" signal for the remainder of the time the clock signal is high. Even if "absent" signals are subsequently received after the receipt of the "present" signal while the clock signal is high, the "present" signal will remain latched. When only "absent" signals are received during the detection period, then an "absent" signal will be latched.

When the clock signal is low, NOR gates $N_1$ and $N_2$, multiplexer $M_1$ and inverters $I_1$ and $I_2$ are in detection mode, acting as a latch during the detection period, such that when a "present" signal is received from the OR gate of the OOB detection circuit, it memorizes the "present" signal for the remainder of the detection period. When a "present" signal is received from the OR gate of the OOB detection circuit, it memorizes the "present" signal for the remainder of the time the clock signal is high. Even if "absent" signals are subsequently received after the receipt of the "present" signal while the clock signal is high, the "present" signal will remain latched. When only "absent" signals are received during the detection period, then an "absent" signal will be latched.

Conversely, when the clock signal is low, NOR gates $N_3$ and $N_4$, multiplexer $M_2$ and inverters $I_3$ and $I_4$ are in non-detection mode (e.g., latch mode) and will output a signal that was recognized during a previous detection period. Where the previous detection period recognized a "present" signal, the output of inverter $I_4$ will continue to output a "present" signal while in non-detection mode. Where the previous detection period recognized an "absent" signal, the output of inverter $I_2$ filter will continue to output a "present" signal while in non-detection mode.

The multiplexer $M_3$ selects the result at the end of a clock signal window, such that any "absent" to "present" switching that occurs during a clock signal window will not be observed by other components in the SERDES.

In order to ensure that the SERDES is able to operate optimally, it may be desirable to minimize the time between when a "present" signal is recognized by the OOB circuit and latched onto by the detection filter, and when the components of the SERDES are placed in a normal operating mode in response to the "present" signal. Conversely, the time between when an "absent" signal is recognized by the OOB circuit and latched onto by the detection filter, and when the components of the SERDES are placed in a lower-power operating mode in response to the "absent" signal need not be minimized. In fact, being able to extend the time between when an "absent" signal is recognized by the OOB circuit and latched onto by the detection filter and when the components of the SERDES are placed in a lower-power operating mode in response to the "absent" signal may allow for greater robustness as it may allow for multiple "absent" signals to be received before confirming that the components of the SERDES are to be placed in a low-power operating mode.

In order to minimize the time between when a "present" signal is recognized by the OOB circuit and latched onto by the detection filter, and when the components of the SERDES are placed in a normal operating mode in response to the "present" signal, while also allowing for the time between when an "absent" signal is recognized by the OOB circuit and latched onto by the detection filter and when the components of the SERDES are placed in a lower-power operating mode in response to the "absent" signal to be extended, a asymmetric digital filter may be coupled to the output of the detection filter.

Figure 7:
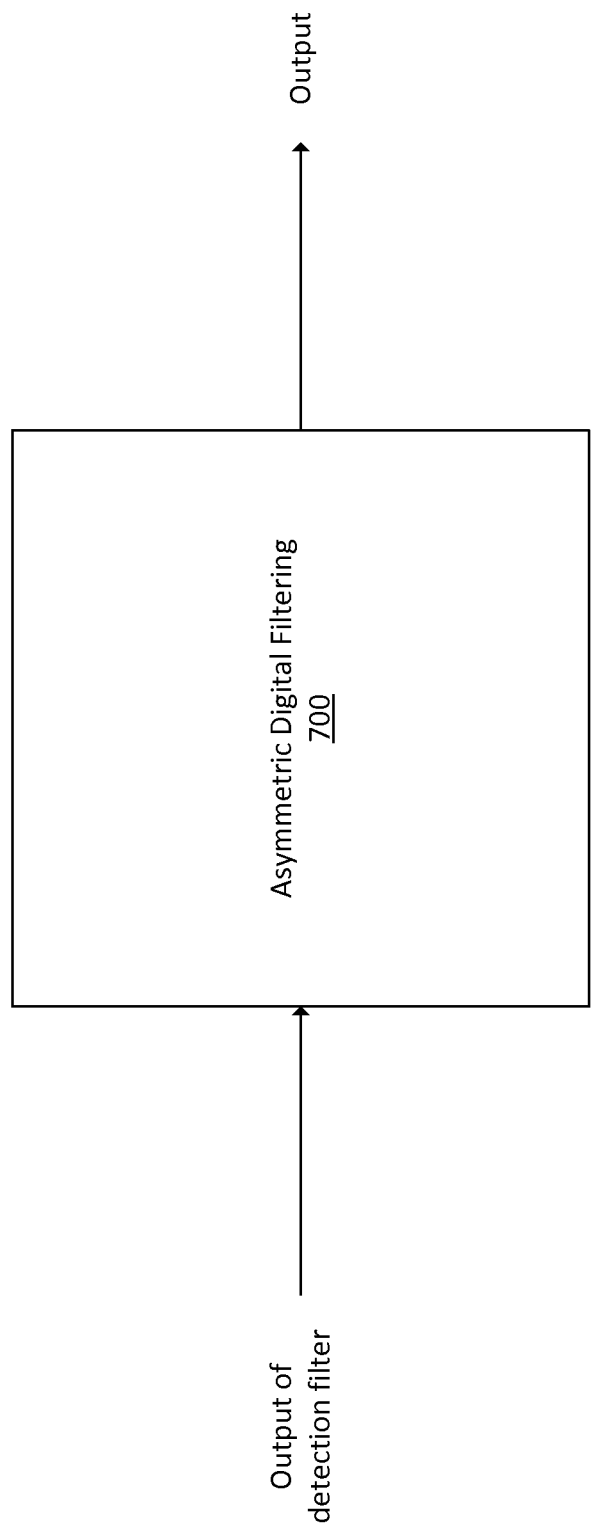
FIG. 7 is a schematic diagram illustrating an asymmetric detection filter for an OOB detection circuit.

FIG. 7 is a schematic diagram illustrating an asymmetric digital filter coupled to the output of the detection filter. The asymmetric digital filter 700 is configured to receive either a "present" signal or an "absent" signal from the detection filter, and to output a "present" signal or an "absent" signal to the components of the SERDES. When the detection filter outputs a "present" signal, it may be assumed that the "present" signal is true. However, when the detection filter outputs an "absent" signal, the "absent" signal may be false. This is because of the nature of toggling that occurs during operation of the OOB detection circuit. Because an "absent" signal is not necessarily reliable, additional filtering may be performed on an "absent" signal to ensure its validity.

The asymmetric digital filter is configured such that when a "present" signal is received from the detection filter, the "present" signal is immediately output from the asymmetric digital filter to allow for the components of the SERDES to be placed in a normal operating mode in response to the "present" signal.

The asymmetric digital filter is also configured such that a wait period is introduced when an "absent" signal is received from the detection filter or a threshold number of "absent" signals must be received from the detection filter before an "absent" signal is output from the asymmetric digital filter to allow for the components of the SERDES to be placed in a low-power operating mode in response to the "absent" signal. This allows for more accurate and reliable detection.

The asymmetric digital filter may be implemented using a physical coding sublayer (PCS) block.

Although particular embodiments have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:

1. An out-of-band (OOB) detection circuit, comprising:
   a positive input node;
   a negative input node;
   a resistive circuit coupled between a first supply node and a ground, the resistive circuit including a first node outputting a positive threshold value and a second node outputting a negative threshold value;
   a first comparator configured to compare a difference between a positive input signal received at the positive input node and a negative input signal received at the negative input node against the positive threshold value
   a first transistor having a gate coupled to the positive input node,
   a second comparator configured to compare the difference between the positive input signal received at the positive input node and the negative input signal received at the negative input node against the negative threshold value
   first and second gain stages coupled to outputs of the first and second comparators, respectively;
   an OR gate coupled to outputs of the first and second gain stages; and
   a detection filter coupled to an output of the OR gate, the detection filter comprising:
      a first NOR gate having a first input coupled to a clock signal;
      a second NOR gate having a first input coupled to the output of the OR gate;
      a third NOR gate having a first input coupled to the output of the OR gate;
      a fourth NOR gate having a first input coupled to an inverse of the clock signal;
      wherein an output of the first NOR gate is coupled to a second input of the second NOR gate, and an output of the second NOR gate is coupled to a second input of the first NOR gate;
      wherein an output of the third NOR gate is coupled to a second input of the fourth NOR gate, and an output of the fourth NOR gate is coupled to a second input of the third NOR gate;
      a first multiplexer having a first input coupled to the output of the first NOR gate and driven by the clock signal;
      a second multiplexer having a first input coupled to the output of the fourth NOR gate and driven by the inverse of the clock signal;
      a first inverter having an input coupled to an output of the first multiplexer;
      a second inverter having an input coupled to an output of the first inverter and an output coupled to a second input of the first multiplexer;
      a third inverter having an input coupled to an output of the second multiplexer;
      a fourth inverter having an input coupled to an output of the third inverter and an output coupled to a second input of the second multiplexer; and
      a third multiplexer coupled having a first input coupled to the output of the second inverter and a second input coupled to the output of the fourth inverter.

2. The OOB detection circuit of claim 1:
wherein the first comparator comprises a first transistor having a gate coupled to the positive input node, a second transistor having a gate coupled to the negative input node, a third transistor having a gate coupled to the second node, and a fourth transistor having a gate coupled to the first node;

wherein the second comparator comprises a fifth transistor having a gate coupled to the negative input node, a sixth transistor having a gate coupled to the positive input node, a seventh transistor having a gate coupled to the second node, and an eighth transistor having a gate coupled to the first node;

wherein a drain of the first transistor is coupled to a drain of the third transistor, a drain of the second transistor is coupled to a drain of the fourth transistor, a source of the first transistor is coupled to a source of the second transistor, and a source of the third transistor is coupled to a source of the fourth transistor; and wherein a drain of the fifth transistor is coupled to a drain of the seventh transistor, a drain of the sixth transistor is coupled to a drain of the eighth transistor, a source of the fifth transistor is coupled to a source of the sixth transistor, and a source of the seventh transistor is coupled to a source of the eighth transistor.

3. The OOB detection circuit of claim 2, wherein:

the first gain stage includes a negative input coupled to the drain of the first transistor and the drain of the third transistor and a positive input coupled to the drain of the second transistor and the drain of the fourth transistor; and the second gain stage includes a positive input coupled to the drain of the fifth transistor and the drain of the seventh transistor and a negative input coupled to the drain of the sixth transistor and the drain of the eighth transistor.

4. The OOB detection circuit of claim 3, further comprising:

a first loading resistor coupled between the first supply node and the negative input of the first gain stage;

a second loading resistor coupled between the first supply node and the positive input of the first gain stage;

a third loading resistor coupled between the first supply node and the positive input of the second gain stage; and a fourth loading resistor coupled between the first supply node and the negative input of the second gain stage.

5. The OOB detection circuit of claim 2, further comprising:

a first biasing transistor coupled between the source of the first transistor and the ground;

a second biasing transistor coupled between the source of the third transistor and the ground;

a third biasing transistor coupled between the source of the fifth transistor and the ground; and a fourth biasing transistor coupled between the source of the seventh transistor and the ground;

wherein a biasing voltage is coupled to a gate of the first biasing transistor, a gate of the second biasing transistor, a gate of the third biasing transistor and a gate of the fourth biasing transistor.

6. The OOB detection circuit of claim 3, further comprising:

a first capacitor coupled between the gate of the first transistor and the drain of the second transistor;

a second capacitor coupled between the gate of the second transistor and the drain of the first transistor;

a third capacitor coupled between the gate of the fifth transistor and the drain of the sixth transistor; and a fourth capacitor coupled between the gate of the sixth transistor and the drain of the fifth transistor.

7. The OOB detection circuit of claim 3, further comprising:

a first loading transistor coupled between the negative input of the first gain stage and a second supply node;

a second loading transistor coupled between the positive input of the first gain stage and the second supply node;

a third loading transistor coupled between the positive input of the second gain stage and the second supply node; and a fourth loading transistor coupled between the negative input of the second gain stage and the second supply node.

8. The OOB detection circuit of claim 1, further comprising:

an asymmetric digital filter coupled to an output of the detection filter.

9. An out-of-band (OOB) detection circuit, comprising:

a positive input node;

a negative input node;

a resistive circuit coupled between a first supply node and ground, the resistive circuit including a first node outputting a positive threshold value and a second node outputting a negative threshold value;

an initial gain stage coupled to the positive input node and the negative input node a first comparator coupled to compare a differential output of the initial gain stage to the positive threshold value a second comparator coupled to compare the differential output of the initial gain stage to the negative threshold value first and second gain stages coupled to outputs of the first and second comparators, respectively;

an OR gate coupled to outputs of the first and second gain stages; and a detection filter coupled to an output of the OR gate, the detection filter comprising:

a first NOR gate having a first input coupled to a clock signal;

a second NOR gate having a first input coupled to the output of the OR gate;

a third NOR gate having a first input coupled to the output of the OR gate;

a fourth NOR gate having a first input coupled to an inverse of the clock signal;

wherein an output of the first NOR gate is coupled to a second input of the second NOR gate, and an output of the second NOR gate is coupled to a second input of the first NOR gate;

wherein an output of the third NOR gate is coupled to a second input of the fourth NOR gate, and an output of the fourth NOR gate is coupled to a second input of the third NOR gate;

a first multiplexer having a first input coupled to the output of the first NOR gate and driven by the clock signal;

a second multiplexer having a first input coupled to the output of the fourth NOR gate and driven by the inverse of the clock signal;

a first inverter having an input coupled to an output of the first multiplexer;

a second inverter having an input coupled to an output of the first inverter and an output coupled to a second input of the first multiplexer;

a third inverter having an input coupled to an output of the second multiplexer;

a fourth inverter having an input coupled to an output of the third inverter and an output coupled to a second input of the second multiplexer; and a third multiplexer coupled having a first input coupled to the output of the second inverter and a second input coupled to the output of the fourth inverter.

10. The OOB detection circuit of claim 9:

wherein the first comparator comprises a first transistor having a gate coupled to a drain of the second gain transistor, a second transistor having a gate coupled to a drain of the first gain transistor, a third transistor having a gate coupled to the second node, and a fourth transistor having a gate coupled to the first node;

wherein the second comparator comprises a fifth transistor having a gate coupled to the drain of the second gain transistor, a sixth transistor having a gate coupled to the drain of the first gain transistor, a seventh transistor having a gate coupled to the second node, and an eighth transistor having a gate coupled to the first node;

wherein a drain of the first transistor is coupled to a drain of the third transistor, a drain of the second transistor is coupled to a drain of the fourth transistor, a source of the first transistor is coupled to a source of the second transistor, and a source of the third transistor is coupled to a source of the fourth transistor; and wherein a drain of the fifth transistor is coupled to a drain of the seventh transistor, a drain of the sixth transistor is coupled to a drain of the eighth transistor, a source of the fifth transistor is coupled to a source of the sixth transistor, and a source of the seventh transistor is coupled to a source of the eighth transistor.

11. The OOB detection circuit of claim 10, wherein:

the first gain stage includes a negative input coupled to the drain of the first transistor and the drain of the third transistor and a positive input coupled to the drain of the second transistor and the drain of the fourth transistor; and the second gain stage includes a positive input coupled to the drain of the fifth transistor and the drain of the seventh transistor and a negative input coupled to the drain of a sixth transistor and the drain of the eighth transistor.

12. The OOB detection circuit of claim 11, further comprising:

a first capacitor coupled between the gate of the first transistor and the drain of the second transistor;

a second capacitor coupled between the gate of the second transistor and the drain of the first transistor;

a third capacitor coupled between the gate of the fifth transistor and the drain of the sixth transistor; and a fourth capacitor coupled between the gate of the sixth transistor and the drain of the fifth transistor.

13. The OOB detection circuit of claim 11, further comprising:

a first loading resistor coupled between the first supply node and the negative input of the first gain stage;

a second loading resistor coupled between the first supply node and the positive input of the first gain stage;

a third loading resistor coupled between the first supply node and the positive input of the second gain stage; and a fourth loading resistor coupled between the first supply node and the negative input of the second gain stage.

14. The OOB detection circuit of claim 10, further comprising:

a first biasing transistor coupled between a source of the first transistor and the ground;

a second biasing transistor coupled between a source of the third transistor and the ground;

a third biasing transistor coupled between a source of the fifth transistor and the ground; and a fourth biasing transistor coupled between a source of the seventh transistor and the ground;

wherein a biasing voltage is coupled to a gate of the first biasing transistor, a gate of the second biasing transistor, a gate of the third biasing transistor and a gate of the fourth biasing transistor.

15. The OOB detection circuit of claim 9, further comprising:

an asymmetric digital filter coupled to an output of the detection filter.

16. The OOB detection circuit of claim 1, wherein the resistive circuit comprises:

a first fixed resistor coupled between the first supply node and the first node, a variable resistor coupled between the first node and a second node, and a second fixed resistor coupled between the second node and ground.

17. The OOB detection circuit of claim 9, wherein the resistive circuit comprises:

a first fixed resistor coupled between the first supply node and the first node, a variable resistor coupled between the first node and a second node, and a second fixed resistor coupled between the second node and ground.

18. An apparatus, comprising:

an out-of-band (OOB) detection circuit coupled to a positive input node and a negative input node, the OOB detection circuit including an output providing either a present signal or an absent signal in response to a differential voltage at the positive and negative input nodes; and a detection filter, coupled to the output of the OOB detection circuit, the detection filter comprising:

a first NOR gate having a first input coupled to a clock signal;

a second NOR gate having a first input coupled to the output of the OR gate;

a third NOR gate having a first input coupled to the output of the OR gate;

a fourth NOR gate having a first input coupled to an inverse of the clock signal;

wherein an output of the first NOR gate is coupled to a second input of the second NOR gate, and an output of the second NOR gate is coupled to a second input of the first NOR gate;

wherein an output of the third NOR gate is coupled to a second input of the fourth NOR gate, and an output of the fourth NOR gate is coupled to a second input of the third NOR gate;

a first multiplexer having a first input coupled to the output of the first NOR gate and driven by the clock signal;

a second multiplexer having a first input coupled to the output of the fourth NOR gate and driven by the inverse of the clock signal;

a first inverter having an input coupled to an output of the first multiplexer;

a second inverter having an input coupled to an output of the first inverter and an output coupled to a second input of the first multiplexer;

a third inverter having an input coupled to an output of the second multiplexer;

a fourth inverter having an input coupled to an output of the third inverter and an output coupled to a second input of the second multiplexer; and a third multiplexer coupled having a first input coupled to the output of the second inverter and a second input coupled to the output of the fourth inverter.

\* \* \* \* \*